United States Patent
Hong et al.

(10) Patent No.: US 9,385,147 B2
(45) Date of Patent: Jul. 5, 2016

(54) ELECTRONIC SYSTEMS, THIN FILM TRANSISTORS, METHODS OF MANUFACTURING THIN FILM TRANSISTORS AND THIN FILM TRANSISTOR ARRAYS

(75) Inventors: Young-ki Hong, Anyang-si (KR);
Jae-woo Chung, Yongin-si (KR);
Seung-ho Lee, Suwon-si (KR);
Joong-hyuk Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 894 days.

(21) Appl. No.: 13/410,393

(22) Filed: Mar. 2, 2012

(65) Prior Publication Data

US 2012/0223385 A1 Sep. 6, 2012

(30) Foreign Application Priority Data

Mar. 3, 2011 (KR) .................. 10-2011-0019091

(51) Int. Cl.
*H01L 27/12* (2006.01)
*H01L 27/28* (2006.01)
*H01L 29/417* (2006.01)
*H01L 29/78* (2006.01)
*H01L 29/786* (2006.01)

(52) U.S. Cl.
CPC .......... *H01L 27/1292* (2013.01); *H01L 27/124* (2013.01); *H01L 27/283* (2013.01); *H01L 29/41733* (2013.01); *H01L 29/7835* (2013.01); *H01L 29/7869* (2013.01); *H01L 29/78645* (2013.01)

(58) Field of Classification Search
CPC .................. H01L 29/7835; H01L 29/66659; H01L 29/0653; H01L 21/823807
See application file for complete search history.

(56) References Cited

U.S. PATENT DOCUMENTS

| 4,907,861 | A | 3/1990 | Muto | |
|---|---|---|---|---|
| 6,891,236 | B1 * | 5/2005 | Yamazaki | 257/410 |
| 2002/0089616 | A1 * | 7/2002 | Hashimoto et al. | 349/44 |
| 2005/0158665 | A1 * | 7/2005 | Maekawa et al. | 430/313 |
| 2005/0214983 | A1 | 9/2005 | Maekawa | |
| 2005/0244995 | A1 * | 11/2005 | Fukuchi et al. | 438/30 |
| 2006/0086937 | A1 | 4/2006 | Fujii et al. | |
| 2007/0090357 | A1 | 4/2007 | Tsou et al. | |
| 2007/0235733 | A1 | 10/2007 | Moriya | |

(Continued)

FOREIGN PATENT DOCUMENTS

| CN | 1679171 A | 10/2005 |
|---|---|---|
| CN | 1707749 A | 12/2005 |

(Continued)

OTHER PUBLICATIONS

European Search Report dated Jul. 9, 2012 issued in European Application No. 12157895.9-1528.

(Continued)

*Primary Examiner* — Zandra Smith
*Assistant Examiner* — John M Parker
(74) *Attorney, Agent, or Firm* — Harness, Dickey & Pierce, P.L.C.

(57) ABSTRACT

Thin film transistors (TFT) and methods of manufacturing the same. A TFT includes a line-shaped gate of uniform thickness. A cross-section of the gate is curved where a side surface and a top surface meet. The gate includes one, or two or more gate lines.

33 Claims, 8 Drawing Sheets

(56) References Cited

U.S. PATENT DOCUMENTS

2007/0295965 A1 12/2007 Chae et al.
2008/0054358 A1 3/2008 Okada et al.
2008/0169462 A1 7/2008 Nakamura et al.

FOREIGN PATENT DOCUMENTS

| CN | 101051671 A | 10/2007 |
| --- | --- | --- |
| CN | 101097964 A | 1/2008 |
| CN | 101154713 A | 4/2008 |
| EP | 0 200 138 | 12/1986 |
| GB | 2 431 514 | 4/2007 |
| JP | 2007-129007 A | 5/2007 |
| JP | 20080065012 A | 3/2008 |
| JP | 20080102485 A | 5/2008 |
| JP | 20080112962 A | 5/2008 |
| JP | 2009-239024 A | 10/2009 |
| JP | 2010-0267752 A | 11/2010 |
| KR | 20040010404 A | 1/2004 |
| WO | WO 02/071478 | 9/2002 |
| WO | WO 2004/021447 | 3/2004 |

OTHER PUBLICATIONS

"Capillary Flow as the Cause of Ring Stains from Dried Liquid Drops," *Nature*, 389, 1997, pp. 827-829.

Chinese Office Action dated Oct. 27, 2015 issued in corresponding Chinese Patent Application No. 201210054770.5 (English translation provided).

Japanese Office Action dated Dec. 15, 2015, issued in corresponding Japanese Patent Application No. 2012-047304 (English translation provided).

\* cited by examiner

ELECTRONIC SYSTEMS, THIN FILM TRANSISTORS, METHODS OF MANUFACTURING THIN FILM TRANSISTORS AND THIN FILM TRANSISTOR ARRAYS

CROSS-REFERENCE TO RELATED APPLICATION

This application claims priority under 35 U.S.C. §119 to Korean Patent Application No. 10-2011-0019091, filed on Mar. 3, 2011, in the Korean Intellectual Property Office (KIPO), the contents of which is incorporated herein in its entirety by reference.

BACKGROUND

1. Field

Example embodiments relate to thin film transistors (TFTs), and in particular, to TFTs in which flatness of a surface of an electrode is improved when the electrode is formed by ink-jet printing.

2. Description of the Related Art

Thin film transistors (TFT) are used in various applications, for example, as a switching device and a driving device of liquid crystal displays (LCDs) and displays using organic light-emitting diodes (OLEDs), and as a selection switch of a cross point-type memory device. Currently, LCDs are widely used as a television (TV) panel, and OLEDs are being researched for use in TVs.

Generally, large-sized TVs or digital information displays (DIDs) should be produced at low cost and with high image quality (in terms of motion picture expression, high resolution, brightness, a black and white ratio, and color reproduction). A TFT should be suitable for use as a switching and driving device of a high performance display formed using large-size substrates of, for example, glass.

TFTs are formed by using a conventional photolithography process. However, the conventional photolithography process is a relatively intricate process, in which a photoresist (PR) is used and removed, and a conductive material or a semi-conductive material is deposited and a portion of the deposited material is removed. Due to high material consumption, the conventional photolithography process is environmentally unfriendly.

As an alternative to photolithography, printing is used to manufacture a TFT, and use of printing is gradually increasing. Among various printing methods, ink-jet printing is widely used. However, when a conductive or semi-conductive material is ink-jet printed, a concentration of solute contained in an ink is greater at an edge of a printing region than any other portion of the printing region when a solvent contained in the ink evaporates. Such an effect is referred to as a 'coffee stain' effect. In the presence of a coffee stain effect, a level of flatness of the printing region is relatively low.

SUMMARY

Thin film transistors (TFTs) with increased flatness levels, including a continuous gate line in a direction, may be provided. Methods of manufacturing TFTs with increased flatness levels by forming a continuous gate line in a direction by ink-jet printing may be provided.

According to example embodiments, a thin film transistor includes at least one gate line extending in a first direction, a gate insulating layer formed on the gate line and a source and a drain formed on the gate insulating layer. At least one selected from the group consisting of the source and the drain includes an extension, and the extension portion extends in parallel with the gate line in the first direction.

The gate line may have a cross-section having a curved portion. Each of the source and the drain may include an extension portion, and the extension portion of the source and the extension portion of the drain are disposed corresponding to facing sides of the gate line. A width of the gate line may be 60 micrometers or less, and a width of the gate line may be about 35 to about 55 micrometers. The gate line may include at least two gate lines that extend in the first direction. The at least one selected from the group consisting of the source and the drain may include a plurality of extension portions.

A width of at least one of the at least two gate lines may be 60 micrometers or less. Each of the source and the drain may include a plurality of extension portions. A portion of the extension portions of each of the source and the drain may be formed on a portion of the gate insulating layer where the extension portions overlap the at least two gate lines, and the extension portions of the source and the extension portions of the drain are alternately arranged. According to some example embodiments, a thin film transistor array may include a plurality of the TFTs of claim 1 commonly sharing one gate line.

According to still other example embodiments, a method of manufacturing a thin film transistor includes forming at least one gate line in a first direction on a substrate by ink-jet printing, forming a gate insulating layer on the gate line and forming a source and a drain on the gate insulating layer. At least one selected from the group consisting of the source and the drain includes an extension portion, and the extension portion is formed extending in parallel with the gate line.

According to at least one example embodiment, a thin film transistor, includes at least one gate line extending in a first direction, a gate insulating layer on the gate line and a source and a drain on the gate insulating layer, at least one of the source and the drain including at least one extension portion, the extension portion extending in parallel with the gate line in the first direction.

According to at least one example embodiment, a method of manufacturing a thin film transistor includes forming at least one gate line in a first direction on a substrate by ink-jet printing, forming a gate insulating layer on the gate line and forming a source and a drain on the gate insulating layer such that at least one of the source and the drain includes at least one extension portion extending in parallel with the gate line.

According to at least one example embodiment, a thin film transistor, includes a channel and a gate line with a curved cross-section overlapping two ends of the channel in a channel width direction.

BRIEF DESCRIPTION OF THE DRAWINGS

Example embodiments will be more clearly understood from the following brief description taken in conjunction with the accompanying drawings. FIGS. 1-8B represent non-limiting, example embodiments as described herein.

FIG. 2 is a plan diagram illustrating an array structure of the TFT of FIG. 1A;

FIG. 4 is a flowchart of the methods of FIGS. 3A-3D;

FIG. 7 is a block diagram of electronic systems according to some example embodiments;

FIG. 8B is a cross-sectional view taken along a portion of line VIIIB-VIIIB' of FIG. 8A illustrating the result of a coffee stain effect.

Figure 1A:
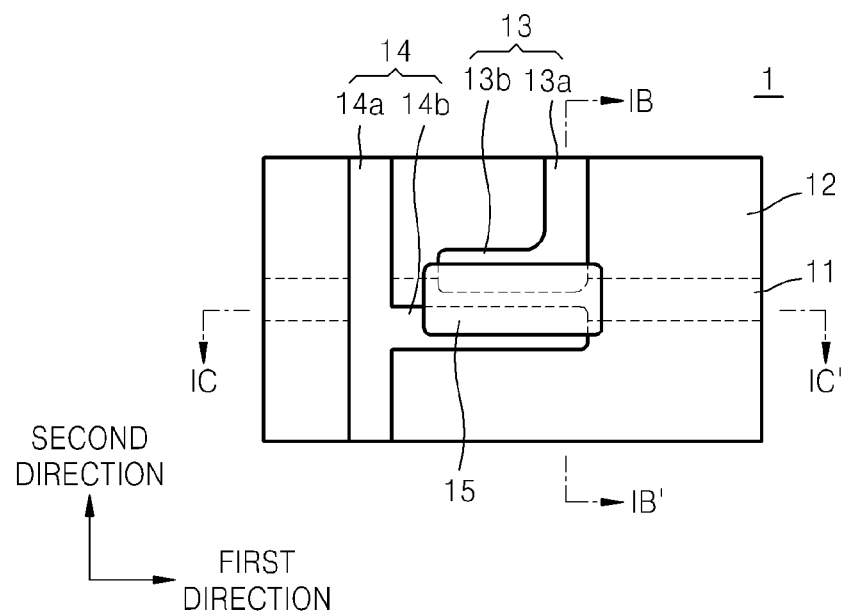
FIG. 1A is a plan diagram illustrating thin film transistors (TFTs) according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a plan diagram illustrating thin film transistors (TFTs) according to example embodiments. Referring to FIG. 1A, a TFT 1 according to at least one example embodiment may include a gate 11, a gate insulating layer 12, a source 13, a drain 14 and a channel 15. The gate 11 may be in a first direction on a substrate and the gate insulating layer 12 may be on the gate 11. The source 13 and the drain 14 may be on the gate insulating layer 12. The source 13 and the drain 14 may include common portions 13a and 14a and extension portions 13b and 14b, respectively. The extension portions 13b and 14b of the source 13 and the drain 14 may be in parallel in the first direction above facing sides of the gate 11. The channel 15 may include a semiconductor material and may be on the source 13 and the drain 14. According to some example embodiments, locations of the source 13 and the drain 14 may be altered with respect to each other.

Figure 1B:
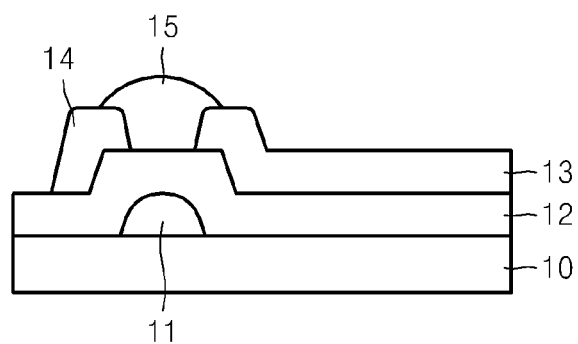
FIG. 1B is a cross-sectional view taken along line IB-IB' of FIG. 1A.

FIG. 1B is a cross-sectional view taken along line IB-IB' of FIG. 1A. Referring to FIG. 1B, the gate 11 may be on a substrate 10. The gate insulating layer 12 may be on the gate 11. The source 13 and the drain 14 may be on portions of the gate insulating layer 12 corresponding to the facing sides of the gate 11. The channel 15 may be on a portion of the gate insulating layer 12 between the source 13 and drain 14.

Figure 1C:
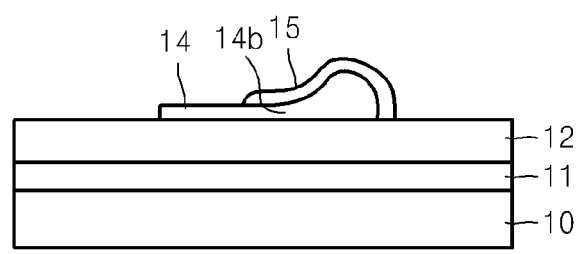
FIG. 1C is a cross-sectional view taken along line IC-IC' of FIG. 1A.

FIG. 1C is a cross-sectional view taken along line IC-IC' of FIG. 1A. FIG. 1C is a cross-sectional view of a TFT 1 taken along the first direction of the gate 11. Referring to FIG. 1C, the gate 11 may be on the substrate 10. The gate insulating layer 12 may be on the gate 11. The drain 14 may be on the gate insulating layer 12 and the channel 15 including a semiconductor material may be on the extension portion 14b of the drain 14. When the gate 11 is formed by ink-jet printing, a thickness of the line-shaped gate 11 may be uniform in the first direction, and the extension portions 13b and 14b of the source 13 and the drain 14 may include protruding ends. According to at least one example embodiment, a TFT 1 includes the gate 11 extending continuously through the TFT 1 in the first direction. For example, the gate line 11 may pass entirely through the TFT 1 such that no end of the gate 11 is in the TFT 1. The flatness of the TFT may overall be a uniform flatness.

When a TFT is manufactured by using a conventional ink-jet printing process, a gate extension portion that is connected to a gate bus line may protrude, and in this case, an end of a gate may protrude upward.

Figure 8A:
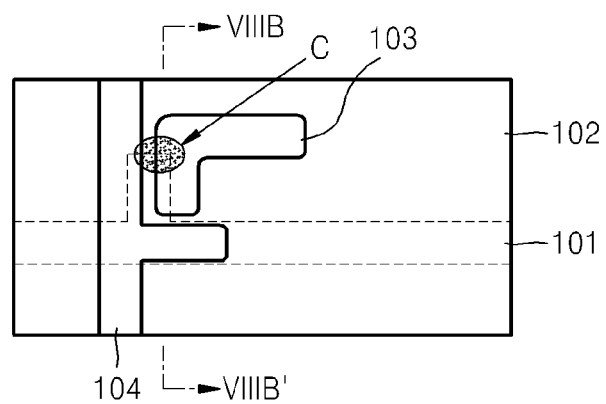
FIG. 8A is a plan diagram illustrating a conventional TFT.
Figure 8B:
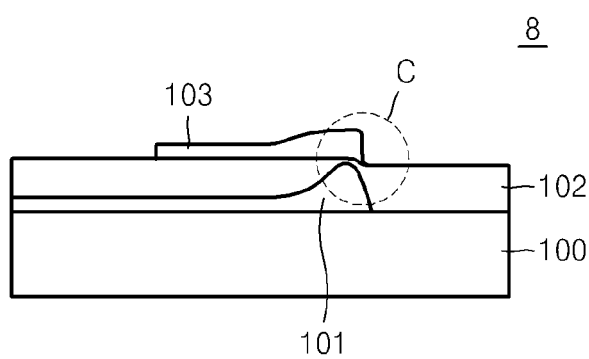

FIG. 8A is a plan diagram illustrating a conventional TFT. FIG. 8B is a cross-sectional view taken along a portion of line VIIIB-VIIIB' of FIG. 8A illustrating the result of a coffee stain effect. FIG. 8B is a view illustrating a protruding end of a gate that is formed due to a coffee stain effect when the gate is formed. Referring to FIGS. 8A and 8B, a TFT 8 may include a gate extension portion 101, a gate insulating layer 102, a source 103 and a drain 104. The gate extension portion 101 may be a gate extension of a gate line on a substrate 100. The gate insulating layer 102 may be on the gate extension portion 101. The source 103 may be on a portion of the gate insulating layer 102 corresponding to the gate extension portion 101.

During ink-jet printing, a plurality of the gate extension portions 101 connected to a gate bus line may be formed. When forming the gate extension portion 101, an evaporation rate of a solvent at an end of the gate extension portion 101 may be greater than those of other portions of the gate extension portion 101. A solute within the ink of the inkjet process may flow toward the end of the gate extension portion 101. A thickness of the gate extension portion 101 may be non-uniform and the end of the gate extension portion 101 may protrude. The coffee stain effect refers to this phenomenon, and may occur at an end of an extension portion (for example, a region C of FIGS. 8A and 8B). The end of the gate extension portion 101 may be thicker than the other portions of the gate extension portion 101 due to the coffee stain effect and protrudes. The gate may be protrude to be relatively close to the source or drain 103 formed above the gate. Current leakage may occur or may increase.

In a TFT 1 according to at least one example embodiment, a gate bus line may formed by ink-jet printing, and the gate bus line may be used as the gate 11. The extension portions 13b and 14b of the source 13 and drain 14 may be formed on the gate 11. In this structure, the thickness of the gate 11 may be constant (e.g., uniform). When a conventional TFT 8 is formed by ink-jet printing, the coffee stain effect may cause a protrusion where an upper surface and a side surface of a gate meet. According to example embodiments, when the gate 11 is formed in a line shape by ink-jet printing, as illustrated in FIG. 1B, a cross-section of the gate 11 may be curved where a side surface and a top surface meet. Even in this case, if a width of the gate 11 is relatively wide, for example, more than about 60 micrometers, the facing sides of the gate 11 may protrude due to the coffee stain effect. Accordingly, the width of the gate 11 may be equal to or less than about 60 micrometers, for example, a few nanometers to about 60 micrometers. For example, the width of the gate 11 may be about 35 to about 55 micrometers.

Figure 2:
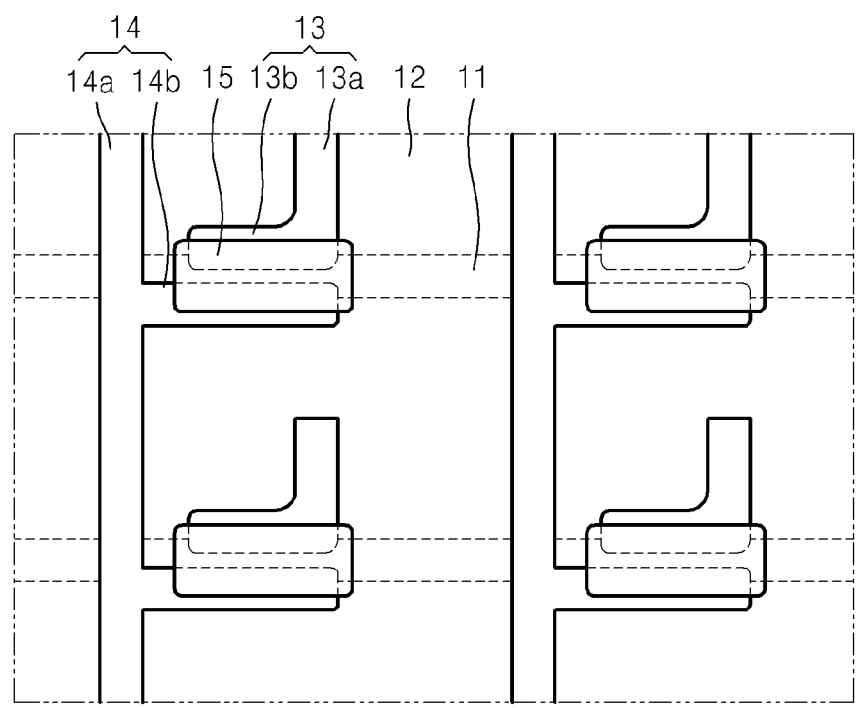

FIG. 2 is a plan diagram illustrating an array structure of the TFT 1 of FIG. 1A. Referring to FIG. 2, a TFT 1 includes the gate 11 extending in the first direction, the gate insulating layer 12 formed on the gate 11, a plurality of the sources 13 and drains 14 on the gate insulating layer 12, and the channel 15 including a semiconductor material. Each of the sources 13 may include the extension portion 13b and each of the drains 14 may include the extension portion 14b. In the array structure, the gate 11 may be line-shaped and commonly shared with a plurality of TFTs. The sources 13 and the drains 14 may be above the gate 11, and a thickness of the gate 11 may be uniform thickness.

Figure 3A:
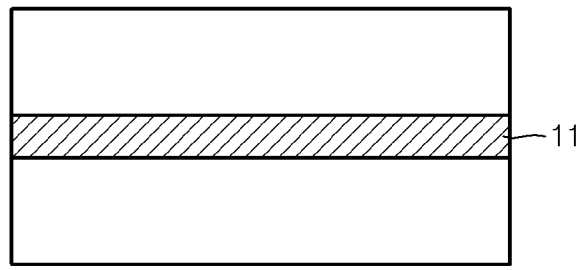
FIGS. 3A-3D are plan diagrams illustrating methods of manufacturing TFTs according to at least one example embodiment.

FIGS. 3A-3D are plan diagrams illustrating methods of manufacturing TFTs according to at least one example embodiment. FIG. 4 is a flowchart of the methods of FIGS. 3A-3D. Referring to FIGS. 3A and 4, a substrate 10 may be prepared (S410). A material of the substrate 10 is not limited, and may be, for example, any one of various materials that are used in a substrate for use in a conventional semiconductor process. For example, the material of the substrate 10 may include glass and/or a plastic material (e.g., polyethylene naphthalene (PEN), polyimide (PI), and/or polyethylene terephthalate (PET)).

A gate 11 may be formed on the substrate 10 (S410). In order to pre-pattern a region in which the gate 11 is to be formed, for example, a photoresist (PR) may be coated on the substrate 10, a conductive ink may be printed on the resultant structure, and a portion of the PR that does not cover the region in which the gate 11 is to be formed may be removed. Hydrophobic coating may be coated on the substrate 10. For example, a self assembly monolayer (SAM) material (e.g., octadecyltrichlorosilane (OTS) and/or n-octadecyltrichlorosilane) and/or a fluorine-containing organic material with a relatively low surface energy may be used. The PR remaining on the region in which the gate 11 is to be formed on the substrate 10 may be removed by being lifted off. A surface energy of the region covered by the PR during the coating may be relatively high and a surface energy of the region not covered by the PR may be relatively low.

A conductive ink may be printed in the high surface energy region to form the gate 11. A thickness of the gate 11 may be, for example, about 60 micrometers or less, for example, about 35 to about 55 micrometers. The gate 11 may include two or more gate lines. In this case, the conductive ink may be, for example, a silver nano ink, a copper (Cu) ink, a gold (Au) ink and/or a PEDOT-PSS ink. The conductive ink may be heat treated after printing. The hydrophobic coating may be removed by, for example, $O_2$ plasma, Ar plasma, $CF_4$ plasma, and/or ultraviolet (UV) ozone cleaning.

Figure 3B:
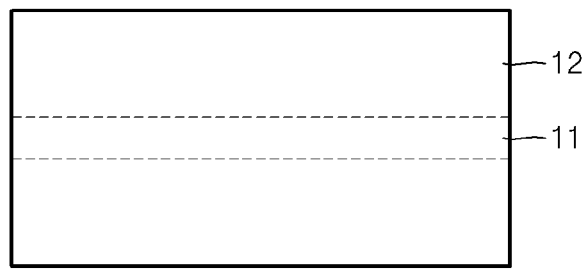
Figure 4:
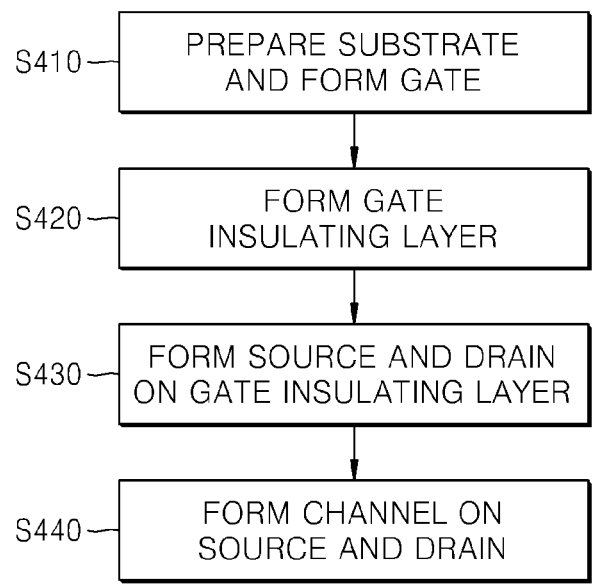

Referring to FIGS. 3B and 4, a gate insulating layer 12 may be formed on the gate 11 (S420). The gate insulating layer 12 may be a conventionally used insulating material, and may be an inorganic insulating material and/or an organic insulating material. According to at least one example embodiment, the gate insulating layer 12 may be a multi-layer structure including an inorganic insulating material and an organic insulating material.

Figure 3C:
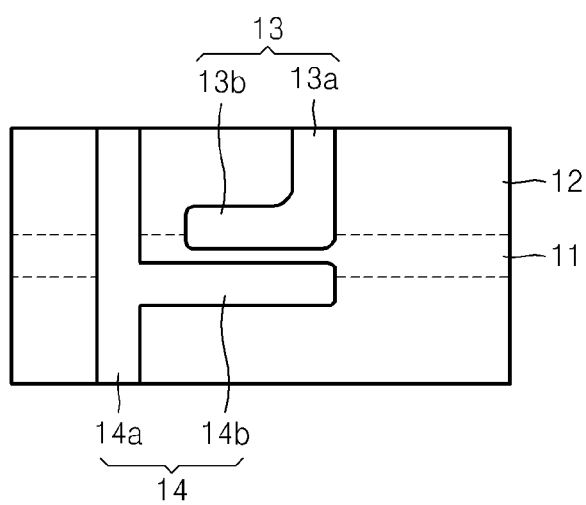
Figure 3D:
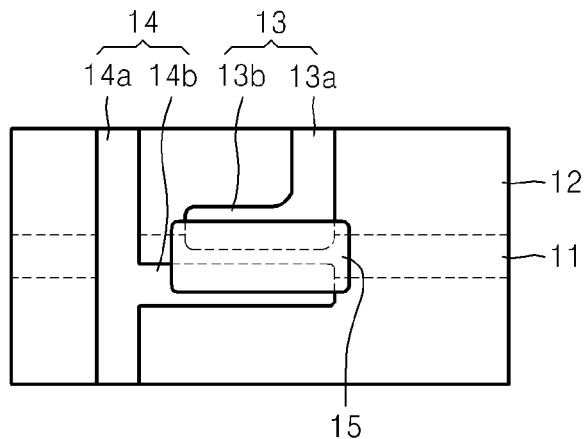

Referring to FIGS. 3C and 4, a source 13 and a drain 14 may be formed on the gate insulating layer 12 (S430). Like the gate 11, the source 13 and the drain 14 may include a conductive material, and the process for forming the gate 11 may also be used to form the source 13 and the drain 14. Referring to FIGS. 3D and 4, a semiconductor material may be printed on the source 13 and the drain 14 to form a channel 15 (S440). The semiconductor material may not be limited, and for example, may be an inorganic semiconductor material and/or an organic semiconductor material. For example, the inorganic semiconductor material may include a Zn oxide-based material (e.g., Zn oxide, Zn—In oxide and/or Zn—In—Ga oxide). The organic semiconductor material may be a low molecular weight and/or polymer organic material with semiconductor characteristics (e.g., pentacene, heteroacenes, oligothiophenes, polythiophenes, polyphenylenevinylene, and/or arylenecarbodiimdes). The channel 15 may be annealed, for example, using a heat treatment. Passivation may be performed to prevent deterioration.

A TFT according to at least one example embodiment may include a plurality of gates, and the number of gates may not be limited.

Figure 5A:
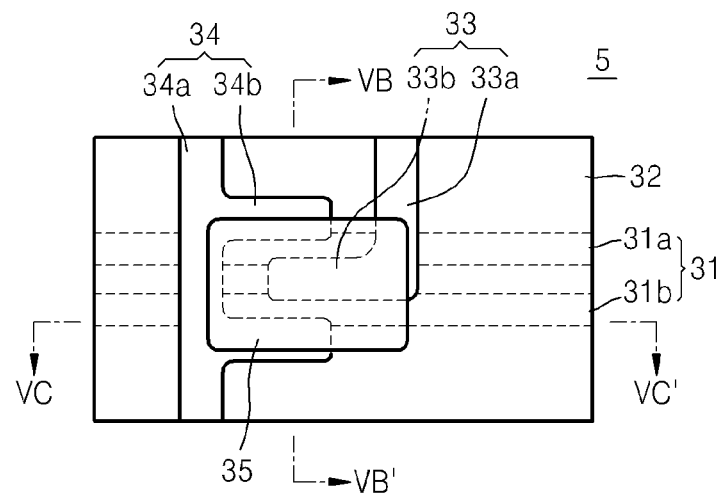
FIG. 5A is a plan diagram illustrating TFTs according to other example embodiments.
Figure 5B:
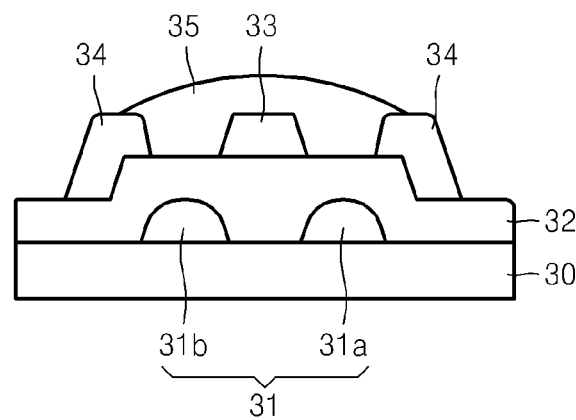
FIG. 5B is a cross-sectional view taken along line VB-VB' of FIG. 5A.
Figure 5C:
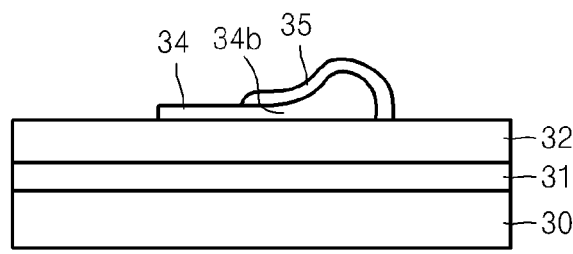
FIG. 5C is a cross-sectional view taken along line VC-VC' of FIG. 5A.

FIG. 5A is a plan diagram illustrating TFTs according to other example embodiments. FIG. 5B is a cross-sectional view taken along line VB-VB' of FIG. 5A. FIG. 5C is a cross-sectional view taken along line VC-VC' of FIG. 5A. According to example embodiments, a TFT 5 may include a gate 31 including two gate lines 31a and 31b. Referring to FIG. 5A, a TFT 5 may include a gate 31, a gate insulating layer 32, a source 33, a drain 34 and a channel 35. The gate 31 may include a first gate 31a and a second gate 31b extending in the first direction on a substrate. The gate insulating layer 32 may be on the gate 31. A source 33 and a drain 34 may be on the gate insulating layer 32. The source 33 and the drain 34 may include common portions 33a and 34a and extension portions 33b and 34b, respectively. The extension portion 33b of the source 33 and the extension portion 34b of the drain 34 may each overlap a portion of the gate 31. The extension portion 33b of the source 33 may extend between the first gate 31a and the second gate 31b. The extension portion 34b of the drain 34 may be on facing sides of the gate 31, for example, on sides of the first gate 31a and second gate 31b not including the source 33. According to example embodiments, locations of the source 33 and the drain 34 may be altered. A channel 35 including a semiconductor material may be on a portion of the gate insulating layer 32 on the gate 31, the source 33 and the drain 34.

Referring to FIG. 5B, the gate 31 may be on a substrate 30, and the gate insulating layer 32 may be on the gate 31. The source 33 and the drain 34 may be respectively on portions of the gate insulating layer 32 corresponding to sides of the gate 31. The channel 35 including a semiconductor material may be on a portion of the gate insulating layer 32 between the source 33 and the drain 34. If the gate 31 is formed in a line form by ink-jet printing (as opposed to an extension form), a cross-section of the gate 31 may be curved where a side surface and a top surface meet. If a width of the gate 31 is greater than about 60 micrometers, top portions of the first and second gates 31a and 31b of the gate 31 may protrude due to the coffee stain effect. The width of the gate 31 may be about a few nanometers to about 60 micrometers (e.g., about 35 to about 55 micrometers). An interval between the first gate 31a and the second gate 31b may be selectively controlled Referring to FIG. 5C, the gate 31 may be on the substrate 30, and the gate insulating layer 32 may be on the gate 31. The drain 34 may be on the gate insulating layer 32. The channel 35 including a semiconductor material may be on the drain 34. If the gate 31 is formed by ink-jet printing as a line, a thickness of the line-shaped gate 31 may be uniform, and the extension portion 33b of the source 33 and/or the extension portion 34b of the drain 34 may include a protruding portion.

Figure 6A:
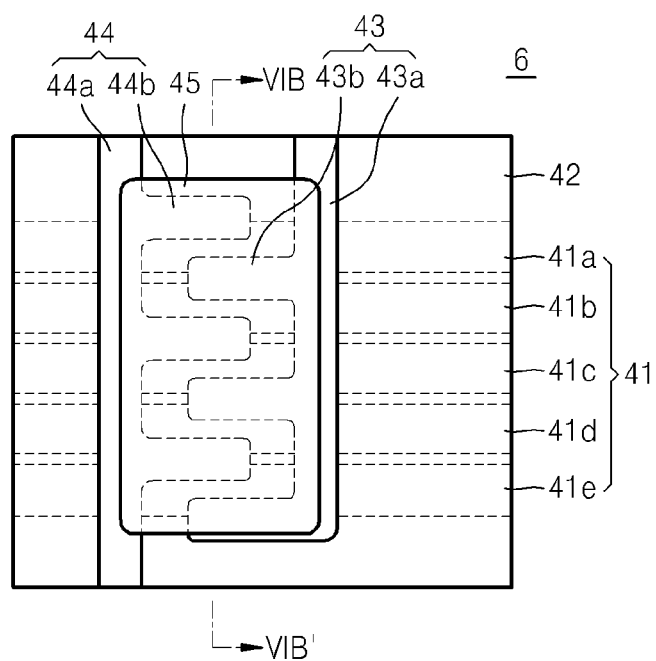
FIG. 6A is a plan diagram illustrating TFTs according to still other example embodiments.
Figure 6B:
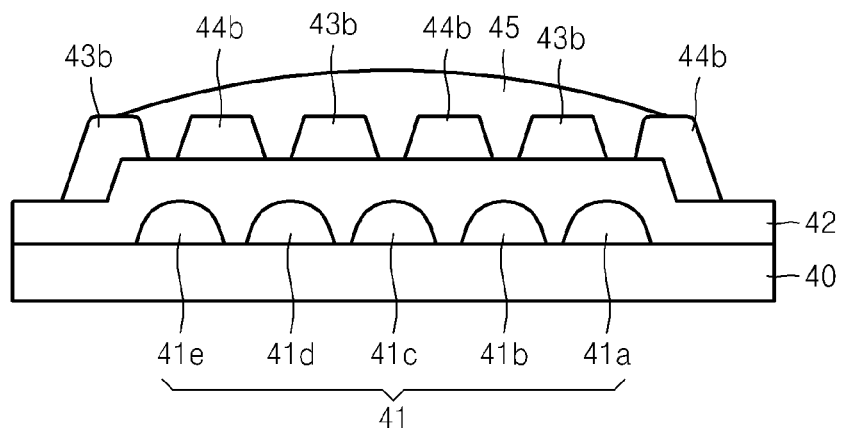
FIG. 6B is a cross-sectional diagram taken along line VIB-VIB' of FIG. 6A.

FIG. 6A is a plan diagram illustrating TFTs according to still other example embodiments. FIG. 6B is a cross-sectional diagram taken along line VIB-VIB' of FIG. 6A. A TFT 6 according to example embodiments may include a gate 41, a gate insulating layer 42, a source 43 and a drain 44. In a TFT 6 according to at least one example embodiment, a gate 41 may include five gate lines 41a-41e. Because the gate 41 includes multiple lines, an extension portion of each of a source and a drain may be in parallel to the gate lines in the first direction. A portion of each of the extension portions on the gate insulating layer 42 may overlap the gate 41, and the extension portions of the source 43 and the extension portions of the drain 44 may alternate on the gate insulating layer 42.

Referring to FIGS. 6A and 6B, a gate 41 including a first gate 41a, a second gate 41b, a third gate 41c, a fourth gate 41d, and a fifth gate 41d in the first direction may be on a substrate 40. A gate insulating layer 42 may be on the gate 41. A source 43 and a drain 44 may be on the gate insulating layer 42. An extension portion 43b of the source 43 and an extension portion 44b of the drain 44 may each overlap a portion of the gate 41 disposed thereunder. According to at least one example embodiment, locations of the source 43 and the drain 44 may be altered. A channel 45 including a semiconductor material may be on a portion of the gate insulating layer 42 disposed on the gate 41, the source 43 and the drain 44.

Referring to FIG. 6B, the gate 41 including the first gate 41a, the second gate 41b, the third gate 41c, the fourth gate 41d, and the fifth gate 41e may be on the substrate 40. The gate insulating layer 42 may be on the gate 41. The extension portion 43b of the source 43 and the extension portion 44b of the drain 44 may be on portions of the gate insulating layer 42 corresponding to sides of the gates 41a, 41b, 41c, 41d, and 41e. The channel 45 including a semiconductor material may be on the extension portion 43b of the source 43, the extension portion 44b of the drain 44 and the gate insulating layer 42. If the gate 41 is formed by ink-jet printing, a cross-section of the gate 41 may be curved where a side surface and a top surface meet, and a width of the gate 41 may be about a few nanometers to about 60 micrometers (e.g., about 35 to about 55 micrometers).

Figure 7:
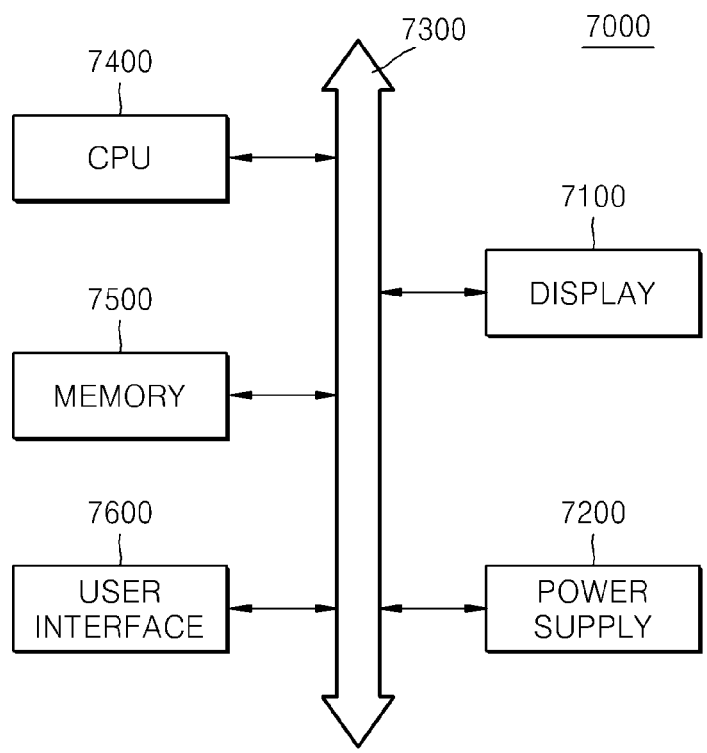

FIG. 7 is a block diagram of electronic systems according to some example embodiments. An electronic system 7000 may be, for example, a mobile phone, a smart phone, a personal digital assistant (PDA), a camcorder, a car navigation system (CNS), and/or a portable multimedia player (PMP), but an electronic system 7000 is not restricted thereto. Referring to FIG. 7, the electronic system 7000 may include a system bus 7300 electrically connecting a display device 7100, a power supply 7200, a central processing unit (CPU) 7400, a memory 7500 and a user interface 7600. The display device 7100 may include a TFT according to example embodiments described with respect to FIGS. 1A-6B. The CPU 7400 may control the overall operation of the electronic system 7000. The memory 7500 may store information necessary for the operation of the electronic system 7000. The user interface 7600 may provide an interface between the electronic system 7000 and a user. The power supply 7200 may supply electric power to other elements (e.g., the CPU 7400, the memory 7500, the user interface 7600 and the display device 7100).

A TFT according to at least one example embodiment includes a line-shaped gate of uniform thickness and performance of the TFT may be improved. A plurality of gates may be included in one TFT and driving efficiency of a TFT may be improved. While example embodiments have been particularly shown and described, it will be understood by one of ordinary skill in the art that variations in form and detail may be made therein without departing from the spirit and scope of the claims.

What is claimed is:

1. A thin film transistor, comprising:
   at least one gate line extending in a first direction;
   a gate insulating layer on the at least one gate line;
   a channel on the gate insulating layer; and
   a source and a drain spaced apart from each other on the gate insulating layer,
     the source and the drain each respectively including a common portion that extends a second direction that crosses the first direction,
     at least one of the source and the drain including at least one extension portion, each extension portion extending in the first direction from a side of the common portion of a corresponding one of the source and drain over a corresponding one of the at least one gate line, wherein
   an end of the at least one extension portion protrudes upward,
   the channel is on the source and the drain,
   the source and the drain are directly on the gate insulating layer, and
   the channel has a curved cross-section that curves over the end of the at least one extension portion.

2. The thin film transistor of claim 1, wherein a cross-section of the gate line includes a curved portion.

3. The thin film transistor of claim 1, wherein
   each of the source and the drain include at least one extension portion, and
   the at least one extension portion of the source and the at least one extension portion of the drain are disposed corresponding to facing sides of the at least one gate line.

4. The thin film transistor of claim 1, wherein a width of one of the gate line is less than or equal to about 60 micrometers.

5. The thin film transistor of claim 4, wherein the width of the gate line is about 35 to about 55 micrometers.

6. The thin film transistor of claim 1, wherein the at least one gate line is at least two gate lines extending in the first direction.

7. The thin film transistor of claim 6, wherein the at least one extension portion is a plurality of extension portions.

8. The thin film transistor of claim 6, wherein a width of at least one of the at least two gate lines is less than or equal to about 60 micrometers.

9. The thin film transistor of claim 6, wherein each of the source and the drain includes a plurality of extension portions.

10. The thin film transistor of claim 9, wherein
    at least one of the plurality of extension portions of the source and the plurality of extension portions of the drain overlaps two of the at least two gate lines, and
    the plurality of extension portions of the source and the plurality of extension portions of the drain are alternately arranged.

11. A thin film transistor array, comprising:
    a plurality of the thin film transistors of claim 1 commonly sharing one of the at least one gate line.

12. The thin film transistor of claim 1, wherein the thin film transistor does not include an end of the one of the at least one gate line.

13. An electronic system, comprising:
    a display device including the thin film transistor of claim 1;
    a power supply;
    a processor;
    a memory;
    a user interface; and
    at least one system bus connecting the display device, the power supply, the processor, the memory and the user interface.

14. The thin film transistor of claim 1, wherein
    both the source and the drain include at least one extension portion,
    a width of the common portion of the source in the first direction is less than a length of the at least one extension portion of the source in the first direction, and
    a length of the common portion of the source in the second direction is greater than a width of the at least one extension portion of the source in the first direction.

15. A method of manufacturing a thin film transistor, the method comprising:
    forming at least one gate line extending in a first direction;
    forming a gate insulating layer on the gate line;
    forming a channel on the gate insulating layer; and
    forming a source and a drain spaced apart from each other on the gate insulating layer,
      the source and the drain each respectively including a common portion that extends a second direction that crosses the first direction,
      at least one of the source and the drain including at least one extension portion, each extension portion extending in the first direction from a side of the common portion of a corresponding one of the source and drain over a corresponding one of the at least one gate line, wherein
    an end of the at least one extension portion protrudes upward,
    the channel is on the source and the drain,
    the source and the drain are directly on the gate insulating layer, and
    the channel has a curved cross-section that curves over the end of the at least one extension portion.

16. The method of claim 15, wherein
    the at least one gate line is formed on a substrate by ink-jet printing;
    the forming at least one gate line includes forming the gate line such that a cross-section of the gate line includes a curved portion.

17. The method of claim 16, wherein the forming a source and a drain includes forming each of the source and the drain with at least one extension portion, the extension portions corresponding to facing sides of the gate line.

18. The method of claim 15, wherein the forming at least one gate line includes:

forming the at least one gate line to a width of less than or equal to about 60 micrometers; and forming the at least one gate line on a substrate by ink jet printing.

19. The method of claim 18, wherein the forming at least one gate line includes forming the gate line to a width of about 35 to about 55 micrometers.

20. The method of claim 15, wherein the forming at least one gate line includes forming at least two gate lines on a substrate by ink jet printing, and the at least two gate lines extend in the first direction.

21. The method of claim 20, wherein the forming a source and a drain includes forming the at least one of the source and the drain with a plurality of extension portions.

22. The method of claim 20, wherein the forming at least two gate lines includes forming at least one of the gate lines to a width of less than or equal to about 60 micrometers.

23. The method of claim 20, wherein the forming a source and a drain includes forming each of the source and the drain with a plurality of extension portions.

24. The method of claim 23, wherein the forming each of the source and drain with a plurality of extension portions includes overlapping each of the extension portions with at least one of the gate lines, and alternately arranging the extension portions of the source with the extension portions of the drain.

25. The method of claim 15, wherein the forming at least one gate line includes:

forming the at least one gate line on a substrate by ink jet printing; and forming the gate line to pass entirely through the thin film transistor.

26. A thin film transistor, comprising:

a gate line with a curved cross-section, the gate line extending a first direction;

a gate insulating layer on the gate line;

a channel on the gate insulating layer;

a plurality of electrodes spaced apart from each other on the gate insulating layer, each of the plurality of electrodes including a common portion connected to at least one extension portion, and each extension portion extends between the channel and the gate line, wherein the plurality of electrodes include a source electrode and a drain electrode, an end of the at least one extension portion protrudes upward, the channel is on the source and the drain, the source and drain electrodes are directly on the gate insulating layer, and the channel has a curved cross-section that curves over the end of the at least one extension portion.

27. The thin film transistor of claim 26, wherein the plurality of electrodes include a plurality of source electrodes alternating with a plurality of drain electrodes on the gate insulating layer, the plurality of source electrodes include the source electrode, the plurality of drain electrodes include the drain electrode, each common portion of the source electrodes is connected with at least one extension portion at a first angle, and each common portion of the source electrodes and each extension portion of the source electrodes are in a same plane parallel to a substrate.

28. The thin film transistor of claim 27, wherein each common portion of the drain electrodes is connected with at least one extension portion at a second angle, each common portion of the drain electrodes and each extension portion of the drain electrodes are in the same plane parallel to the substrate.

29. The thin film transistor of claim 26, further comprising:

a plurality of gate lines, wherein the plurality of gate lines include the gate line, each extension portion of the plurality of electrodes extends in the first direction parallel over one of the gate lines.

30. The thin film transistor of claim 29, wherein each one of the plurality of electrodes is on a portion of the gate insulating layer between a corresponding pair of the plurality of gate lines.

31. The thin film transistor of claim 29, wherein a width of each of the plurality of gate lines is less than or equal to about 60 micrometers.

32. An electronic system, comprising:

a display device including the thin film transistor of claim 26;

a power supply;

a processor;

a memory;

a user interface; and at least one system bus connecting the display device, the power supply, the processor, the memory and the user interface.

33. The thin film transistor of claim 26, wherein each extension portion extends from a sidewall of a corresponding one of the plurality of electrodes, each common portion extends in a second direction that crosses the first direction, a width of the common portion in the first direction is less than a length of the at least one extension portion in the first direction, and a length of the common portion in the second direction is greater than a width of the at least one extension portion in the first direction.

* * * * *